(12) United States Patent
Faistauer et al.

(10) Patent No.: US 9,287,247 B2
(45) Date of Patent: Mar. 15, 2016

(54) LIGHT-EMITTING DIODE ARRANGEMENT, MODULE, AND METHOD FOR PRODUCING A LIGHT-EMITTING DIODE ARRANGEMENT

(71) Applicant: EPCOS AG, Munich (DE)

(72) Inventors: Christian Faistauer, Frauental (AT); Stefan Leopold Hatzl, Graz (AT); Sebastian Brunner, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/437,785

(22) PCT Filed: Sep. 25, 2013

(86) PCT No.: PCT/EP2013/069944
§ 371 (c)(1),
(2) Date: Apr. 22, 2015

(87) PCT Pub. No.: WO2014/067717
PCT Pub. Date: May 8, 2014

(65) Prior Publication Data
US 2015/0287703 A1 Oct. 8, 2015

(30) Foreign Application Priority Data
Oct. 30, 2012 (DE) .......... 10 2012 110 397

(51) Int. Cl.
*H01L 25/16* (2006.01)
*H01L 33/48* (2010.01)
*H05B 33/08* (2006.01)
*H05K 1/16* (2006.01)

(52) U.S. Cl.
CPC ............ *H01L 25/167* (2013.01); *H01L 33/483* (2013.01); *H05B 33/086* (2013.01); *H05K 1/167* (2013.01); *H01L 2924/0002* (2013.01); *H01L 2933/0033* (2013.01); *H05K 2201/10106* (2013.01)

(58) Field of Classification Search
None
See application file for complete search history.

(56) References Cited

U.S. PATENT DOCUMENTS

2010/0078668 A1   4/2010  Kim
2011/0248836 A1  10/2011  Brandes et al.
(Continued)

FOREIGN PATENT DOCUMENTS

DE   102008033176 A1   1/2010
DE   102008039530 A1   2/2010
(Continued)

OTHER PUBLICATIONS

Using Laser Trimmable Resistors, downloaded from URL <http://www.vishay.com/docs/28893/usinglasertrimmableresistors.pdf> on Aug. 20, 2015.*
(Continued)

*Primary Examiner* — Joseph Schoenholtz
(74) *Attorney, Agent, or Firm* — Slater & Matsil, L.L.P.

(57) ABSTRACT

A light-emitting diode arrangement includes a light-emitting diode and a coding resistor for coding the light-emitting diode. The coding resistor is embodied as a star connection of a number of resistors. Furthermore, a module includes a plurality of light-emitting diode arrangements. Furthermore, a method for producing a light-emitting diode arrangement is specified, wherein the coding of a coding resistor is carried out depending on a determined characteristic of the light-emitting diode.

20 Claims, 2 Drawing Sheets

(56) References Cited

U.S. PATENT DOCUMENTS

| | | |
|---|---|---|
| 2011/0279058 A1 | 11/2011 | Dari et al. |
| 2012/0319159 A1 | 12/2012 | Nakatani et al. |
| 2013/0193851 A1* | 8/2013 | Alon .................. H03H 7/00 315/121 |
| 2014/0265838 A1* | 9/2014 | Edelmeier .......... H05B 33/0854 315/77 |

FOREIGN PATENT DOCUMENTS

| | | | |
|---|---|---|---|
| DE | 102008059468 A1 | 6/2010 | |
| DE | 102009051866 A1 * | 5/2011 | ............ F21S 48/115 |
| EP | 2437581 A1 | 4/2012 | |
| WO | 2011108227 A1 | 9/2011 | |

OTHER PUBLICATIONS

Definition of 'has' downloaded from URL < http://dictionary.reference.com/browse/has> on Aug. 21, 2015.*

Sharma, P., "Voll-LED-Scheinwerfer (Full-LED Headlights)," http://www.all-electronics.de/texte/anzeigen/47357/, Aug. 24, 2012, 3 pages.

* cited by examiner

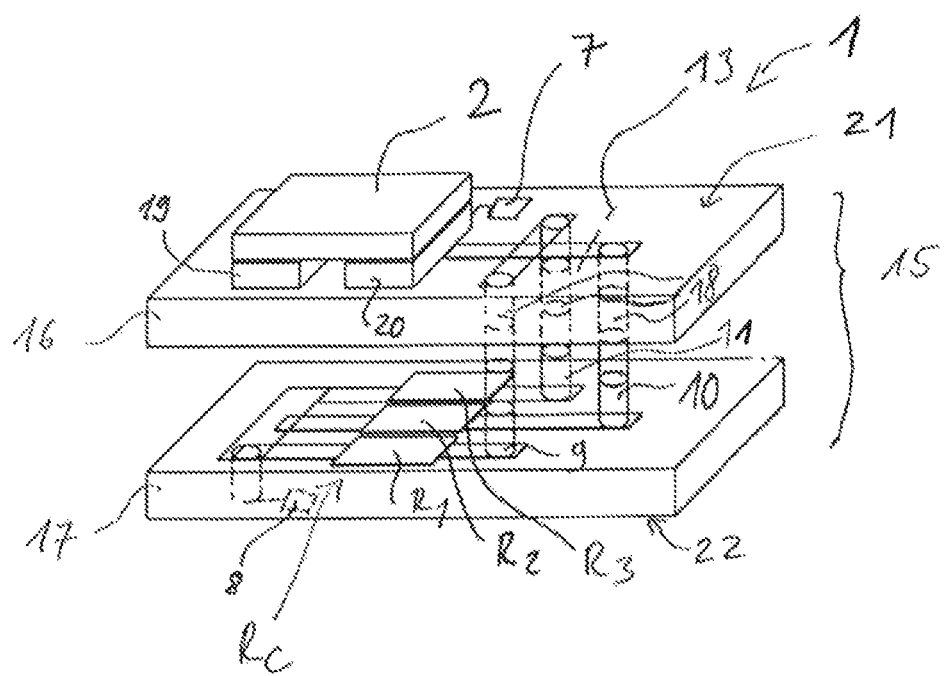

LIGHT-EMITTING DIODE ARRANGEMENT, MODULE, AND METHOD FOR PRODUCING A LIGHT-EMITTING DIODE ARRANGEMENT

This patent application is a national phase filing under section 371 of PCT/EP2013/069944, filed Sep. 25, 2013, which claims the priority of German patent application 10 2012 110 397.6, filed Oct. 30, 2012, each of which is incorporated herein by reference in its entirety.

TECHNICAL FIELD

A light-emitting diode arrangement comprising a light-emitting diode (LED), in particular a light-emitting diode chip, is specified.

BACKGROUND

LEDs can be used in the automotive sector, for example, in front headlights. As a result of variations in the manufacturing process, LEDs often have different characteristics with regard to luminous efficiency and color for identical driving currents. Such fluctuations are undesirable.

SUMMARY

Embodiments of the present invention specify a light-emitting diode arrangement, a module and a method for producing a light-emitting diode arrangement having improved properties.

A light-emitting diode arrangement is specified. The light-emitting diode arrangement comprises a light-emitting diode (LED), in particular a light-emitting diode chip. Moreover, the light-emitting diode arrangement comprises a coding resistor for coding the light-emitting diode.

The coding of the LED is preferably effected before the LED is installed. In particular, the coding is effected on a substrate, i.e., at the wafer level.

By way of example, the coding resistor codes a characteristic of the LED, e.g., the luminous efficiency and color of the LED, for a specific current flow. Consequently, by ascertaining the resistance for the coding resistor, it is possible to deduce the characteristic of the LED. This enables the LED to be driven in accordance with its specific characteristic, such that a uniform luminous efficiency can be achieved, for example, when a plurality of LEDs having different characteristics are used.

The characteristic of the LED is preferably ascertained for the purpose of coding. The LED can accordingly be classified in a class. This is also referred to as "binning" (classification in classes). Each class can be assigned a resistance of the coding resistor. The resistance of the coding resistor is chosen, in particular set, in accordance with the class. Consequently, the installation location is coded in association with the LED.

By way of example, the light-emitting diode arrangement comprises a carrier. The LED is preferably arranged on the carrier, in particular on a top side of the carrier. The LED is preferably coded before the LED together with its carrier is installed.

By way of example, the carrier can comprise a ceramic or an organic material. By way of example, the main body comprises at least one of the materials from aluminum oxide or aluminum nitride or a ceramic of the LTCC ("low temperature cofired ceramics") or HTCC ("high temperature cofired ceramics") type or consists of one of said materials. The carrier can be embodied as a printed circuit board. By way of example, the carrier is of multilayer design.

In accordance with one embodiment, the coding resistor is at least partly buried in the carrier. In a further embodiment, the coding resistor is arranged on the carrier.

The coding resistor preferably comprises at least one resistor, in particular a discrete resistance element. The resistor can be embodied using thin-film or thick-film technology, for example. In accordance with one embodiment, the coding resistor comprises a plurality of resistors. The resistors are electrically interconnected with one another in order to form the coding resistor.

The resistor is buried in the carrier, for example. In this way, space can be saved on the surface of the carrier. In particular, the surface remains free for the configuration of the optical system or for other components such as ESD protection or NTC, where "ESD" stands for "electrostatic discharge", and "NTC" stands for "negative temperature coefficient". Furthermore, protection of the resistor can be obtained as a result of the burying. A buried resistor is possible particularly in the case of a multilayered carrier, for example, in the case of a multilayer ceramic.

Alternatively, the resistor can also be arranged at an outer side of the carrier, for example, a top side or underside of the carrier.

The coding of the coding resistor according to the LED can be implemented in analog or digital fashion. Consideration is also given to a mixture of analog and digital coding. The type of coding is chosen according to the requirement in respect of binning classes. The number of binning classes depends on the respective application.

In one embodiment, the coding resistor comprises at least one electrical lead, preferably a plurality of electrical leads. In particular, the coding resistor can comprise a plurality of resistors, wherein each resistor comprises a lead. The coding of the coding resistor can be implemented by the performance of an interruption or the non-performance of an interruption of the lead. By way of example, the coding is effected by means of laser trimming of the leads. In the case of a plurality of leads, the possible coding classes result from the possible combinations of interrupted and non-interrupted leads. Preferably, a resistance for the coding resistor which codes the LED is set in this case by a suitable choice of interrupted and non-interrupted leads. This embodiment is one example of a digital coding.

In one embodiment, a coding is effected by trimming the coding resistor. In particular, the coding resistor can comprise at least one resistor which is coded by trimming. The resistor is produced using thick-film technology, for example. During trimming, the resistance is preferably set by material removal, in particular by a process of cutting the resistor. An increase in the resistance can be produced in this case. This embodiment enables an analog coding.

Trimming is suitable, for example, for a resistor arranged on an outer side of the carrier. However, resistors in the interior can also be trimmed by means of a specific technology.

In one embodiment, the coding resistor can comprise at least one resistor which is designed for measuring a temperature. By way of example, the resistor has a temperature coefficient, preferably a positive temperature coefficient. This enables intelligent driving, e.g., of the LED.

In accordance with a further aspect of the invention, a module comprising a plurality of such light-emitting diode arrangements is specified. Preferably, the module comprises a further carrier, on which the light-emitting diode arrangements are arranged. In such a module, a coding resistor is preferably provided for each LED, said coding resistor characterizing the LED.

During the operation of the module, the resistance of the assigned coding resistor is preferably measured for each LED. The LED is driven according to the resistance. In this way, it is possible to achieve a uniform emission characteristic of the module in the case of LEDs of different classes.

In accordance with a further aspect of the invention, a method for producing a light-emitting diode arrangement is specified. In this case, provision is made of a light-emitting diode and a coding resistor for coding the light-emitting diode. The light-emitting diode is preferably arranged on a carrier. The carrier preferably has the coding resistor. In particular, the coding resistor can be at least partly buried in the carrier and/or at least partly arranged on the carrier. A characteristic of the light-emitting diode, for example, an optical or electrical characteristic, is determined. The characteristic can concern, in particular, the luminous efficiency or the color of the LED. The coding resistor is coded depending on the characteristic determined. In particular, the resistance of the coding resistor can be set for coding purposes.

Preferably, the light-emitting diode arrangement described above is produced by the method described, such that all functional and structural properties of the light-emitting diode arrangement can correspondingly be provided in the method.

Preferably, the light-emitting diode is arranged on the carrier before the coding of the coding resistor. In particular, the light-emitting diode can be arranged on the carrier before the characteristic of said light-emitting diode is determined.

BRIEF DESCRIPTION OF THE DRAWINGS

The subjects described here are explained in greater detail below on the basis of schematic exemplary embodiments, which are not true to scale.

In the figures:

FIG. 3 shows a light-emitting diode arrangement in a schematic perspective view.

Preferably, in the following figures, identical reference signs refer to functionally or structurally corresponding parts of the different embodiments.

DETAILED DESCRIPTION OF ILLUSTRATIVE EMBODIMENTS

Figure 1:
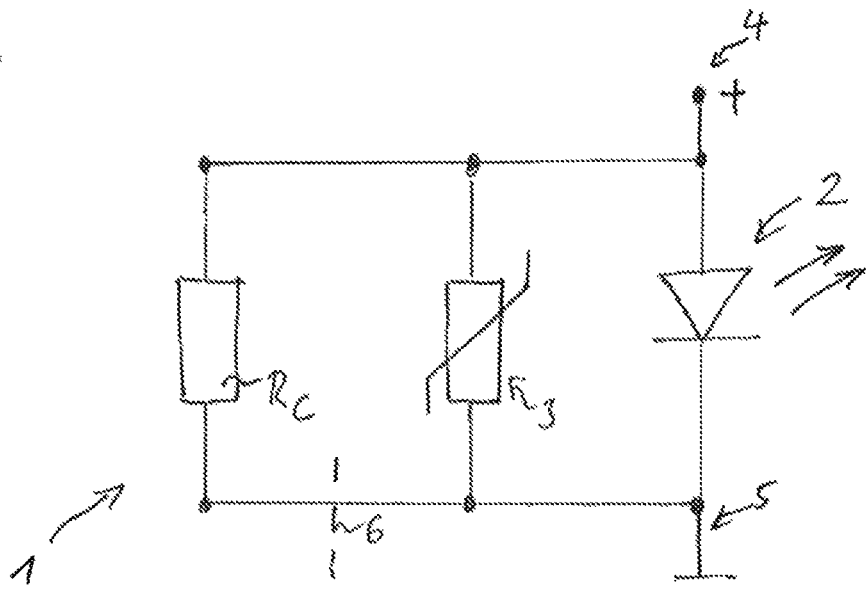
FIG. 1 shows a schematic circuit diagram of a light-emitting diode arrangement.

FIG. 1 shows a schematic circuit diagram of a light-emitting diode arrangement 1. The light-emitting diode arrangement comprises a light-emitting diode (LED) 2, in particular a light-emitting diode chip, and a coding resistor $R_C$. The coding resistor $R_C$ is connected in parallel with the LED 2. The resistance of the coding resistor $R_C$ is specific to a characteristic of the LED 2, such that the specific coding resistor $R_C$ represents a coding for the specific LED 2. In particular, the coding resistor $R_C$ can code the luminous efficiency or the color of the LED 2 in the case of a current-voltage characteristic curve. By measuring the resistance of the coding resistor $R_C$, it is thus possible to deduce the characteristic of the LED 2.

The light-emitting diode arrangement 1 comprises an ESD protection component 3, which is interconnected in parallel with the LED 2. The ESD protection component 3 preferably serves to protect the light-emitting diode chip against overvoltages, in particular, against electrostatic discharges.

The light-emitting diode arrangement 1 comprises a first and a second terminal 4, 5 embodied as cathode and anode. In the case of a very high resistance of the coding resistor $R_C$, the anode and cathode terminals 4, 5 can be used jointly by the LED 2 and the coding resistor $R_C$ because a very small leakage current would flow. The measurement can take place in the "reverse" direction in this case. In the case of a smaller resistance of the coding resistor $R_C$, by way of example, a further terminal is integrated and the interconnection is severed, for example, at the separating line 6 depicted in a dashed manner.

Figure 2:
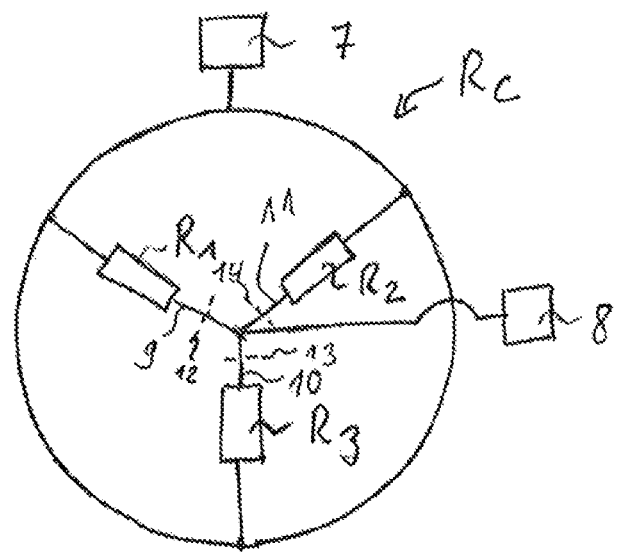
FIG. 2 shows a schematic circuit diagram of a coding resistor.

FIG. 2 shows a schematic circuit diagram of a coding resistor $R_C$ embodied as a star connection of a plurality of resistors $R_1$, $R_2$, $R_3$. The resistance of the coding resistor $R_C$ can be determined by means of a first and second contact 7, 8.

The coding resistor $R_C$ can be coded by a specific performance or non-performance of interruptions 12, 13, 14 of the leads 9, 10, 11 to the respective resistors $R_1$, $R_2$, $R_3$ for a specific LED. In this way, the coding is effected digitally. In the case of three resistors $R_1$, $R_2$, $R_3$ having different resistances, for example, seven possible resistances can result for the coding resistor $R_C$. In particular, one possible resistance results for the interruption of none of the three leads 9, 10, 11, a further possible resistance results for the interruption of all three leads 9, 10, 11, three further possible resistances result for the case where only one lead 9, 10, 11 is interrupted, and three further possible resistances result for the case where two of the three leads 9, 10, 11 are interrupted. Seven binning classes are thus available for coding purposes.

The performance of interruptions 12, 13, 14 of the leads 9, 10, 11 is preferably effected after the measurement of the characteristic of the LED 2 which is intended to be coded by the coding resistor $R_C$.

FIG. 3 shows a schematic perspective view of a light-emitting diode arrangement 1 in which an LED 2 is arranged on a carrier 15. The LED 2 is electrically contacted and fixed to the carrier 15 by means of connection contacts 19, 20.

In the present case, the carrier 15 is embodied using multilayered LTCC technology. Only the topmost layer 16 and a further layer 17 are depicted, for reasons of clarity in the illustration. One or a plurality of further layers can be present between the topmost layer 16 and the further layer 17. In addition, one or a plurality of further layers can also be present below the further layer 17.

The light-emitting diode arrangement 1 comprises three resistors $R_1$, $R_2$, $R_3$ interconnected to form a coding resistor $R_C$. The resistors $R_1$, $R_2$, $R_3$ are embodied as thin-film resistors. The resistors $R_1$, $R_2$, $R_3$ are buried in the carrier 15. The resistors $R_1$, $R_2$, $R_3$ are interconnected with the LED 2 by leads 9, 10, 11. The leads 9, 10, 11 are embodied as vias 18 in sections and are led toward the outside at the top side 21 of the carrier 15. Via stands for "vertical interconnect access" and denotes a plated-through hole.

After the LED characteristic has been measured, the coding resistor $R_C$ is coded to the LED 2 by means of the leads 9, 10, 11 being specifically interrupted, in particular severed, or not interrupted. The leads 9, 10, 11 can be interrupted by means of a laser, for example. The present case indicates that only the second lead 10, which connects the second resistor $R_2$ to the LED 2, is provided with an interruption 13 for coding purposes. This results in a total resistance of the coding resistor $R_C$ which codes the characteristic of the LED 2.

The total resistance of the coding resistor $R_C$ can be measured by means of two contacts 7, 8 in order thus to determine the characteristic of the LED 2. The contacts 7, 8 are arranged on the top side 21 and respectively the underside 22 of the carrier 15 and are electrically connected to the coding resistor $R_C$. In the present case, the underside 22 is formed by that side of the further layer 17 which faces away from the LED 2. However, even further layers can be present below the further layer 17, wherein the underside 22 is formed by the bottommost of said further layers.

The invention claimed is:

1. A light-emitting diode arrangement, comprising:
   a light-emitting diode;
   a coding resistor for coding the light-emitting diode, wherein the coding resistor comprises a plurality of resistors electrically interconnected with one another; and
   a carrier, wherein the coding resistor comprises a resistor that is buried in the carrier.

2. The light-emitting diode arrangement according to claim 1, wherein the plurality of resistors electrically are interconnected in a star connection.

3. The light-emitting diode arrangement according to claim 1, further comprising an electrical lead to the resistor that is buried in the carrier, wherein the electrical lead is located on a top side of the carrier.

4. The light-emitting diode arrangement according claim 1, wherein the coding resistor comprises an electrical lead and wherein the coding is implemented by the performance or non-performance of an interruption of the electrical lead.

5. The light-emitting diode arrangement according claim 1, wherein the coding resistor comprises a resistor that is designed to measure temperature of the light-emitting diode.

6. A light-emitting diode arrangement, comprising:
   a light-emitting diode; and
   a coding resistor for coding the light-emitting diode, wherein the coding resistor comprises a plurality of resistors electrically interconnected with one another and wherein the coding resistor comprises a resistor that is trimmed for a coding purpose.

7. The light-emitting diode arrangement according to claim 6, further comprising a carrier, wherein the coding resistor comprises a resistor that is buried in the carrier.

8. The light-emitting diode arrangement according to claim 7, further comprising a carrier, wherein the coding resistor comprises a resistor arranged on an outer side of the carrier.

9. A light-emitting diode arrangement, comprising:
   a light-emitting diode;
   a coding resistor for coding the light-emitting diode, wherein the coding resistor comprises a plurality of resistors electrically interconnected with one another; and
   a multilayer carrier of multilayer design, the light-emitting diode being electrically connected to the carrier.

10. The light-emitting diode arrangement according to claim 9, wherein the coding resistor comprises a resistor that is buried in the carrier.

11. The light-emitting diode arrangement according to claim 10, further comprising an electrical lead to the resistor that is buried in the carrier, wherein the electrical lead is located on a top side of the carrier.

12. The light-emitting diode arrangement according to claim 9, wherein the coding resistor comprises a resistor arranged on an outer side of the carrier.

13. A method for producing a light-emitting diode arrangement, the method comprising:
   providing a light-emitting diode; and
   providing a coding resistor for coding the light-emitting diode, wherein the coding resistor comprises a plurality of resistors electrically interconnected with one another
   determining a characteristic of the light-emitting diode; and
   coding the coding resistor based on the determined characteristic, wherein coding the coding resistor comprises trimming the coding resistor.

14. The method according to claim 13, further comprising arranging the light-emitting diode on a carrier before coding the coding resistor.

15. The method according to claim 14, wherein the carrier has the coding resistor.

16. The method according to claim 13, wherein the coding resistor comprises an electrical lead and wherein the coding is implemented by either interrupting or not interrupting the electrical lead.

17. The method according to claim 13, determining a characteristic of the light-emitting diode comprises determining a characteristic related to luminous efficiency.

18. A method for producing a light-emitting diode arrangement, the method comprising:
   providing a light-emitting diode;
   providing a coding resistor for coding the light-emitting diode, wherein the coding resistor comprises a plurality of resistors electrically interconnected with one another;
   determining a characteristic of the light-emitting diode related to a color of the light-emitting diode; and
   coding the coding resistor based on the determined characteristic.

19. The method according to claim 18, wherein the coding resistor comprises an electrical lead and wherein the coding is implemented by either interrupting or not interrupting the electrical lead.

20. The method according to claim 18, wherein coding the coding resistor comprises trimming the coding resistor.

* * * * *